(12) United States Patent
Scilla

(10) Patent No.: US 9,099,516 B2
(45) Date of Patent: Aug. 4, 2015

(54) POWER BIPOLAR STRUCTURE, IN PARTICULAR FOR HIGH VOLTAGE APPLICATIONS

(71) Applicant: STMicroelectronics S.r.I., Agrate Brianza (IT)

(72) Inventor: Giuseppe Scilla, Catania (IT)

(73) Assignee: STMicroelectronics S.r.l, Agrate Brianza (IT)

( * ) Notice: Subject to any disclaimer, the term of this patent is extended or adjusted under 35 U.S.C. 154(b) by 258 days.

(21) Appl. No.: 13/714,013

(22) Filed: Dec. 13, 2012

(65) Prior Publication Data

US 2013/0153897 A1 Jun. 20, 2013

(30) Foreign Application Priority Data

Dec. 15, 2011 (IT) .............................. MI2011A2278

(51) Int. Cl.
| | |
|---|---|
| *H03K 17/06* | (2006.01) |
| *H01L 29/73* | (2006.01) |
| *H01L 27/102* | (2006.01) |
| *H03K 17/0812* | (2006.01) |
| *H03K 17/082* | (2006.01) |
| *H03K 17/12* | (2006.01) |
| *H03K 17/14* | (2006.01) |
| *H01L 27/02* | (2006.01) |
| *G01R 19/00* | (2006.01) |
| *H01L 29/06* | (2006.01) |

(52) U.S. Cl.
CPC ............ *H01L 29/73* (2013.01); *H01L 27/0207* (2013.01); *H01L 27/1022* (2013.01); *H01L 29/7302* (2013.01); *H03K 17/0826* (2013.01); *H03K 17/08126* (2013.01); *H03K 17/12* (2013.01); *H03K 17/14* (2013.01); *G01R 19/0092* (2013.01); *H01L 29/0692* (2013.01); *H03K 2217/0027* (2013.01)

(58) Field of Classification Search
USPC .................. 327/419, 427, 432, 478, 482–484, 327/540–542, 574–576
See application file for complete search history.

(56) References Cited

U.S. PATENT DOCUMENTS

| | | | | |
|---|---|---|---|---|
| 4,618,816 A | * | 10/1986 | Monticelli | .................... 323/316 |
| 4,886,982 A | | 12/1989 | Villa et al. | |
| 5,177,659 A | * | 1/1993 | Zisa et al. | ..................... 361/103 |

(Continued)

OTHER PUBLICATIONS

Villa, F., "Improved Second Breakdown of Integrated Bipolar Power Trasnsistors," IEEE Transactions on Electron Devices ED-33(12):1971-1976, Dec. 1986.

*Primary Examiner* — An Luu
(74) *Attorney, Agent, or Firm* — Seed IP Law Group PLLC

(57) ABSTRACT

A power bipolar structure is described having at least one first, one second and one third terminal and including at least one power bipolar transistor having a finger structure coupled to at least one driving block. The power bipolar transistor includes at least one elemental bipolar cell connected to these first, second and third terminals and including at least one power elemental bipolar structure corresponding to a finger of the power bipolar transistor, electrically coupled between the first and second terminals and coupled to a driving section of the driving block by at least one sensing section able to detect information on the operation of the power elemental bipolar structure, the sensing section being in turn coupled to a control circuit and supplying it with a current value as a function of the local temperature of the power elemental bipolar structure.

18 Claims, 5 Drawing Sheets

(56) References Cited

U.S. PATENT DOCUMENTS 5,939,921 A * 8/1999 Strauss et al. ............ 327/322

5,999,041 A * 12/1999 Nagata et al. ............ 327/538
6,396,249 B1  5/2002 Itakura et al.

* cited by examiner

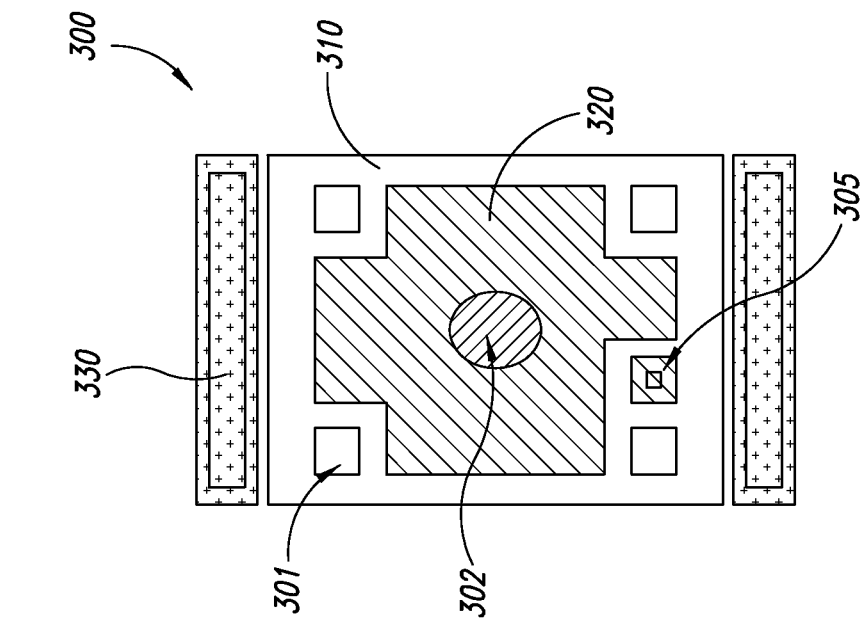
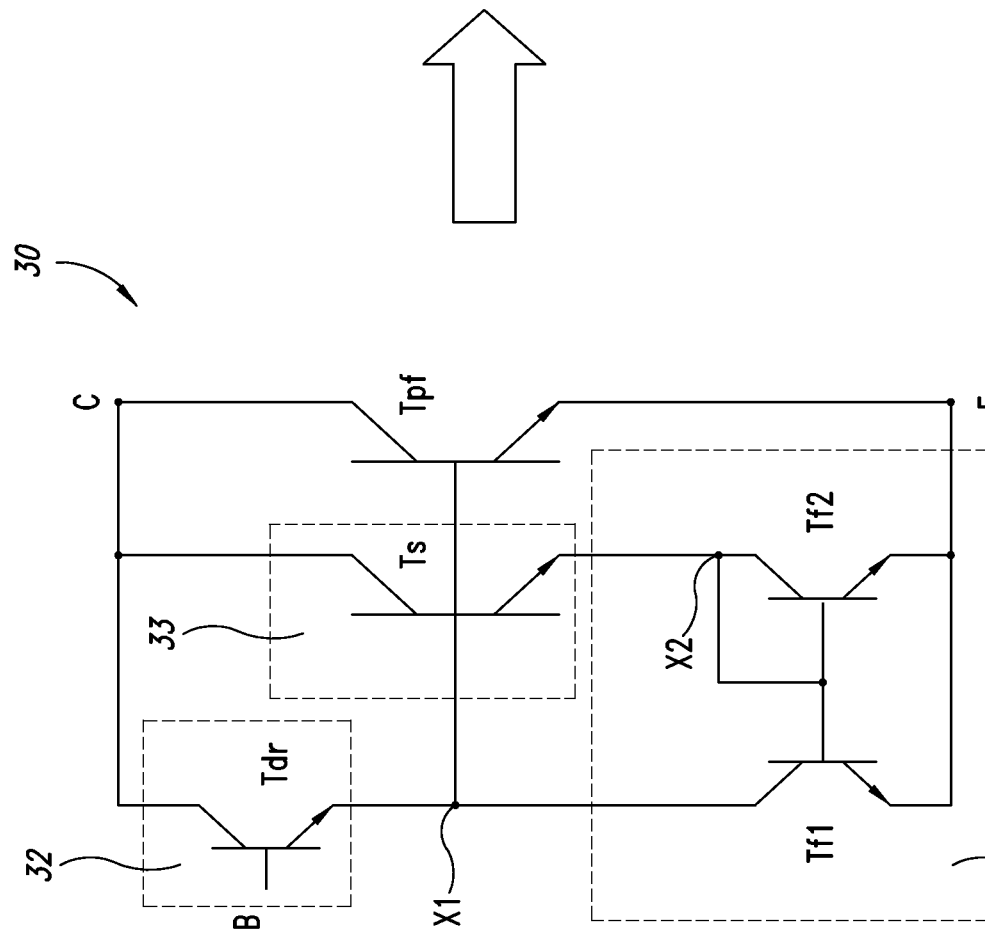
FIG. 3B
FIG. 3A

POWER BIPOLAR STRUCTURE, IN PARTICULAR FOR HIGH VOLTAGE APPLICATIONS

BACKGROUND

1. Technical Field

The present disclosure relates to a power bipolar structure.

More specifically, the disclosure relates to a power bipolar structure including at least one power bipolar transistor having a finger structure coupled to at least one driving block.

2. Description of the Related Art

As it is well known, bipolar transistors are subjected to the phenomenon known as second breakdown that causes their breakdown or failure due to local increases of temperature, up to melting at high temperatures. This phenomenon of the second breakdown is one of the most serious problems that limits the use of bipolar transistors, for example in power applications.

It is suitable to note that the reason of the failure of a power bipolar transistor at high temperatures is substantially linked to the negative drift of the base-emitter voltage Vbe of the transistor itself, which increases with temperature the direct current of its collector terminal, for a value equal to about 8% per 170 degrees C.

Further to this increase of temperatures, it occurs in fact that hot spots are created on the surface of the bipolar transistor, due to the positive feedback of its base-emitter voltage Vbe. Short-circuits are also created in correspondence with the base-emitter junction with local formation of melting spots between metallic layers, in particular aluminum Al, and semiconductor layers, in particular silicon Si, in the case of these materials, starting from 577 degrees C.

Moreover, for ensuring suitable voltage and current conditions in which a power bipolar transistor may operate without damaging itself, commonly indicated as safe operating area or SOA, the layout of such a power bipolar transistor is established taking also into account the current performance degradation in case of high values of the collector-emitter voltage Vce, which however further increases the final size of the transistor itself.

Different solutions have been proposed for reducing the problems linked to the phenomenon of second breakdown of power bipolar transistors. For example, it is possible to make reference to the article to Flavio F. Villa entitled: "Improved Second Breakdown of Integrated Bipolar Power Transistors", IEEE Trans. Electron Devices, vol. ED-33, pp 1971-1976, December 1986.

In particular, a first branch of known solutions aims at ensuring a uniform current flow at the base-emitter junction of a power bipolar transistor, so as to limit in particular the generation of hot spots in this junction, limiting in this way the risk of a melting between silicon and metallization layers.

Normally, the uniformity of the current flow is obtained by trying to balance the power bipolar transistor with a suitable layout and with a finger structure, in particular for its emitter terminals, aimed at trying to avoid the problem of local hot spots, this finger structure being distributed so as to occupy a wide silicon surface.

A first known solution, schematically shown in FIG. 1, uses such a finger structure and sections the power bipolar transistor and its driver so that each finger of the power bipolar transistor has its dedicated driver.

In particular, FIG. 1 shows a power bipolar structure, globally indicated with 10. The power bipolar structure 10 comprises a power bipolar transistor with a finger structure, schematically shown as a power section 11 comprising a plurality of power transistors, Tp1 ... Tpn. The power bipolar structure 10 also comprises a driving section 12 connected to the power section 11.

More in particular, the power transistors, Tp1 ... Tpn, of the power section 11, corresponding to different fingers, in particular emitter ones, of a power bipolar transistor, have respective first terminals, in particular collector ones, connected to each other and to a first terminal of the power bipolar structure 10, in particular a collector terminal C, second terminals, in particular emitter ones, connected to each other and to a second terminal of the power bipolar structure 10, in particular an emitter terminal E, as well as third terminals, in particular base ones, connected to the driving section 12.

Similarly, the driving section 12 comprises a plurality of driving transistors, Td1 ... Tdn, in a number corresponding to the plurality of power transistors, Td1 ... Tdn, of the power section 11, i.e., to the number of emitter fingers of the power bipolar transistor comprised in the power bipolar structure 10. The driving transistors, Td1 ... Tdn, have respective first terminals, in particular emitter ones, connected to the collector terminal C of the power bipolar structure 10, second terminals, in particular collector ones, connected to respective base terminals of the power transistors, Tp1 ... Tpn, of the power section 11, as well as third terminals, in particular base terminals, connected to each other and to a third terminal, in particular a base terminal B of the power bipolar structure 10.

The type of layout of the power bipolar structure 10 allows to obtain a remarkable improvement of the safe operating area SOA with respect to a standard layout.

For making a power bipolar structure stronger with respect to the second breakdown current, usually indicated as Isb, it is also known to use ballast resistances connected to the base and/or emitter terminals of the structure, as schematically shown in FIG. 2A.

In particular, a bipolar structure 20 comprises at least one power bipolar transistor T1, in particular with a finger structure or a multiemitter, and a driving bipolar transistor T2 inserted, in parallel to each other, between a first terminal, in particular a collector terminal C, and a second terminal, in particular an emitter terminal E of the bipolar structure 20. The bipolar structure 20 also comprises a first ballast resistor Rb connected to the base terminals of the transistors T1 and T2, in turn connected to a third terminal, in particular a base terminal B of the bipolar structure 20. The bipolar structure 20 also comprises further ballast resistors, Re1 and Re2, connected to respective emitter terminals of the multiemitter power bipolar transistor T1.

It is suitable to underline that the presence of the ballast resistors, connected to the base and/or emitter terminals of the bipolar structure, makes this bipolar structure stronger against the breakdown phenomenon due to the negative feedback that these resistances create when the intrinsic current of the bipolar structure increases. Thanks to this feedback, the current in the base terminal B of the bipolar structure 20 is reduced, which reduces the current in the collector terminal C.

A first example of layout for a bipolar structure 20 is shown for example in FIG. 2B, globally indicated with 200.

In particular, in the layout 200 at least the power bipolar transistor T1 and the driving bipolar transistor T2, base contacts 201 and emitter contacts 202, as well as at least one ballast resistance indicated with 203 are present.

An alternative embodiment that is widely used as layout for a bipolar structure is schematically shown in FIG. 2C, globally indicated with 200'. Elements corresponding to the embodiment shown in FIG. 2B have been given the same reference numbers by way of illustration.

In particular, the layout 200' comprises a first layer 210, in particular a base one, wherein the base contacts 201 are realized as well as a second layer 220, in particular an emitter one, wherein the emitter contacts 202 are realized and at least one ballast resistance, in particular a base resistance indicated with 203.

Although advantageous under several viewpoints, also these known solutions do not allow a correct control of the second breakdown current of a power bipolar transistor and do not allow thus to have a uniform current flow at its base-emitter junction so as to limit the generation of local hot spots and allow to use such a bipolar structure also in power applications.

BRIEF SUMMARY

One embodiment of the present disclosure is a power bipolar structure able to maintain a thermal balance on its whole surface, thus overcoming the limits and the drawbacks still affecting the bipolar structures realized according to the prior art.

One embodiment of the present disclosure is a power bipolar structure with transistors having a finger structure and a mechanism for monitoring the temperatures of the single fingers, dynamically balancing the inflow of current to the base terminal according to such detected temperatures.

One embodiment of the present disclosure is a power bipolar structure having first, second, and third terminals and at least one power bipolar transistor having a finger structure coupled to at least one driving block. The bipolar structure includes at least one elemental bipolar cell, connected to the first, second and third terminals, and at least one elemental power bipolar structure corresponding to a finger of the power bipolar transistor, inserted between the first and second terminals and coupled to a driving section of the driving block by at least one sensing section able to detect information on the operation of the elemental power bipolar structure, the sensing section being in turn coupled to a control circuit and supplying it with a current value depending on a local temperature of the elemental power bipolar structure.

According to an aspect of the disclosure, the driving section may be electrically coupled between the first terminal and a first inner circuit node and may include at least one driving bipolar transistor, this first inner circuit node being in turn coupled to a base terminal of the elemental power bipolar structure.

Furthermore, the sensing section may be electrically coupled between the first terminal and a second inner circuit node and may include at least one sensing bipolar transistor, having in turn a base terminal connected to the base terminal of the elemental power bipolar structure and to the first inner circuit node.

According to this aspect of the disclosure, the sensing bipolar transistor may have a base-emitter voltage value that follows the progress of a base-emitter voltage value of the elemental power bipolar structure and supply a collector current value being function of the temperature of the elemental power bipolar structure.

According to another aspect of the disclosure, the control circuit may be connected to the second terminal and coupled to the base terminal of the elemental power bipolar structure, this control circuit having the possibility to comprise a bipolar transistor current mirror, able to draw an increase of current in the base terminal of the elemental power bipolar structure, draining an exceeding current value towards the second terminal.

The control circuit may be also connected to the first and second inner circuit nodes and to the second terminal and may comprise at least one first and one second feedback bipolar transistor, the first feedback bipolar transistor being electrically coupled between the first inner circuit node and the second terminal and having a base terminal connected to a base terminal of the second feedback bipolar transistor, in turn inserted between the second inner circuit node and the second terminal, this base terminal of the second feedback bipolar transistor being also connected to the second inner circuit node.

According to an aspect of the disclosure, the power bipolar structure may comprise a plurality of elemental bipolar cells electrically coupled, in parallel to each other, between these first and second terminal and connected to the third terminal.

According to this aspect of the disclosure, the sensing sections of the elemental bipolar cells may form a sensing block of the power bipolar structure.

Furthermore, according still to this aspect of the disclosure, the control circuits of the elemental bipolar cells may form a control block of the power bipolar structure.

According to another aspect of the disclosure, the power bipolar structure may comprise at least one elemental bipolar cell for each emitter finger.

Finally, according to yet another aspect of the disclosure, the power bipolar structure may comprise a plurality of elemental bipolar cells for each emitter finger.

The characteristics and the advantages of the power bipolar structure according to the disclosure will be apparent from the following description of an embodiment given by way of indicative and non-limiting example with reference to the annexed drawings.

BRIEF DESCRIPTION OF THE SEVERAL VIEWS OF THE DRAWINGS

In these drawings:

FIG. 3A schematically shows an elemental bipolar cell of a power bipolar structure realized according to the disclosure;

FIG. 3B schematically shows a layout for the elemental bipolar cell of FIG. 3A;

DETAILED DESCRIPTION

Figure 1:
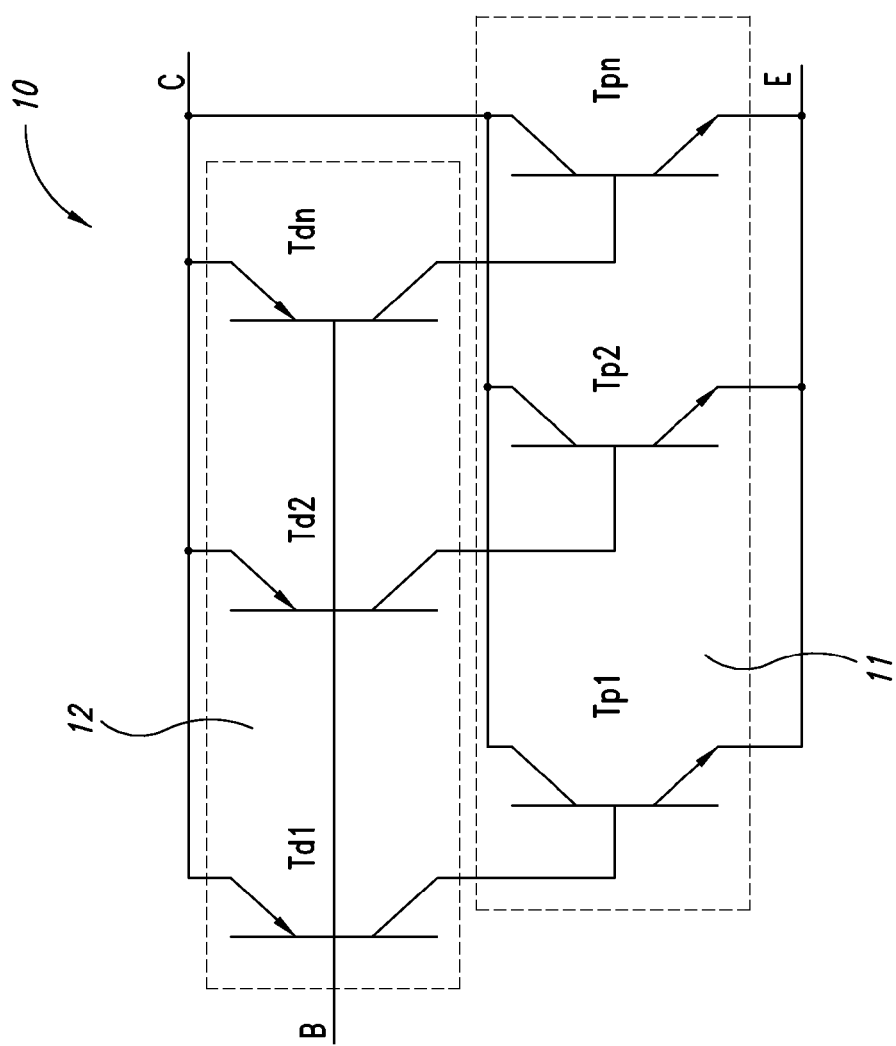
FIG. 1 schematically shows a power bipolar structure realized according to a first known embodiment.
Figure 2B:
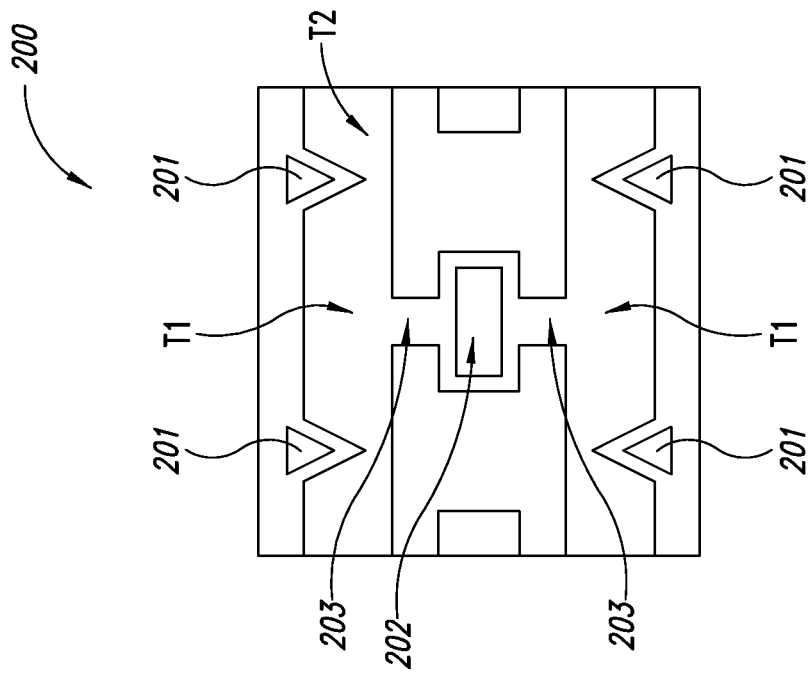
FIGS. 2B and 2C schematically show the layout for the power bipolar structure of FIG. 2A.
Figure 2A:
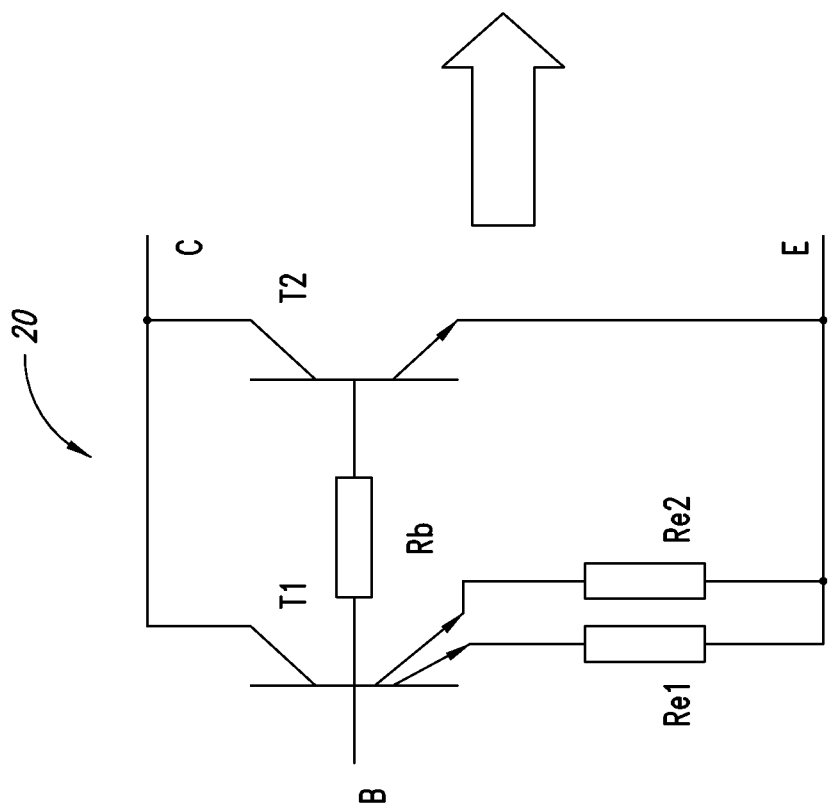
FIG. 2A schematically shows a power bipolar structure realized according to a second known embodiment.
Figure 2C:
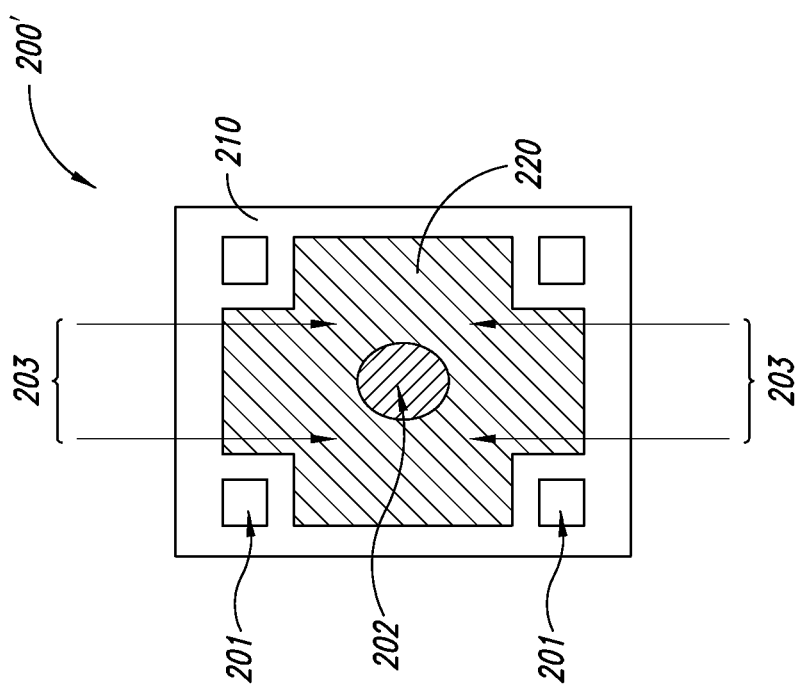

According to an aspect of the disclosure, a power bipolar structure is proposed comprising at least one power bipolar transistor having a finger structure, the bipolar structure being formed by a plurality of elemental bipolar cells, each comprising at least one finger of the power bipolar transistor of the structure.

In particular, with reference to FIG. 3A, an elemental bipolar cell for the power bipolar structure realized according to the present disclosure is described.

The elemental bipolar cell 30 has a first terminal, in particular a collector terminal C, a second terminal, in particular an emitter terminal E and a third terminal, in particular a base terminal B.

This elemental bipolar cell 30 comprises in particular at least one finger of the power bipolar transistor of the structure, in particular a multiemitter transistor, shown as a elemental power bipolar structure Tpf, electrically coupled between the collector terminal C and the emitter terminal E. Moreover, the elemental bipolar cell 30 comprises a driving section 32 electrically coupled between the collector terminal C and a first inner circuit node X1 and including for example at least one driving bipolar transistor Tdr. The first inner circuit node X1 is in turn coupled to a base terminal of the elemental power bipolar structure Tpf. In the example shown in the figure, the driving bipolar transistor Tdr is of the npn type.

The driving section 32 could also comprise further components, such as for example resistors or capacitors.

According to an aspect of the disclosure, the elemental bipolar cell 30 also comprises a sensing section 33, electrically coupled between the collector terminal C and a second inner circuit node X2 and including for example at least one sensing bipolar transistor Ts, having a base terminal connected to the base terminal of the elemental power bipolar structure Tpf and to the first inner circuit node X1. In the example shown in the figure, the sensing bipolar transistor Ts is of the npn type.

Also the sensing section 33 could also comprise further components, such as for example resistors or capacitors.

In this way, it is possible to obtain information on the operation of the elemental power bipolar structure Tpf, that corresponds to a finger of the multiemitter power bipolar transistor of the bipolar structure including the elemental bipolar cell 30, information that are read exactly thanks to the sensing section 33 being connected to this elemental bipolar structure Tpf in the elemental bipolar cell 30. More in particular, the sensing bipolar transistor Ts of this sensing section 33 is suitable to supply a collector current value depending on the base-emitter voltage Vbe of the elemental power bipolar structure Tpf, which is function of the temperature of this elemental power bipolar structure Tpf, i.e., a local temperature of the multiemitter power bipolar transistor of the bipolar structure. More in particular, it is suitable to note that the base-emitter voltage value of the sensing bipolar transistor Ts comprised in the sensing section 33 follows the progress of the base-emitter voltage of the elemental power bipolar structure Tpf. In this way, being the base-emitter voltage of a bipolar transistor an inverse function of its temperature, also the values of the collector current of the sensing bipolar transistor Ts comprised in the sensing section 33 and of the elemental power bipolar structure Tpf are function of the local temperature of the respective transistor, increasing when the local temperature of the elemental bipolar cell 30 comprising this elemental power bipolar structure Tpf and this sensing section 33 increases.

According to another aspect of the disclosure, the elemental bipolar cell 30 comprises also a control circuit 34, connected to the first and to the second inner circuit node, X1 and X2, as well as to the emitter terminal E. More in particular, the control circuit 34 comprises at least one first feedback bipolar transistor Tf1, electrically coupled between the first inner circuit node X1 and the emitter terminal E and having a base terminal connected to the base terminal of a second feedback bipolar transistor Tf2, in turn electrically coupled between the second inner circuit node X2 and the emitter terminal E, the base terminal of the second feedback bipolar transistor Tf2 being also connected to the second inner circuit node X2. In the example shown in the figure, the first and second feedback bipolar transistors, Tf1 and Tf2, are of the npn type.

Furthermore, the control circuit 34 could also comprise other components, such as for example resistors or capacitors.

In substance, according to the example shown in FIG. 3A, the control circuit 34 comprises a bipolar transistor current mirror, able to draw up an increase of the current in the base terminal of the elemental power bipolar structure Tpf connected thereto, draining a surplus towards the emitter terminal E.

It is thus possible to dynamically balance the current that flows in the fingers of the power bipolar transistor during its operation. In particular, the control circuit 34 for the power bipolar elemental structure Tpf, corresponding to a finger of the power bipolar transistor, regulates the current thanks to the information supplied by the transistor itself and to the sensing transistor Ts that operates as thermal sensor for detecting the local thermal level in the transistor.

It is suitable to underline that, according to an aspect of the disclosure, the power transistor may comprise a plurality of fingers, each finger having in turn the possibility to comprise a plurality of cells, each cell comprising in turn a elemental power bipolar structure Tpf, as above described.

It is thus possible to insert a sensing section per each single cell or per each single finger of the power bipolar transistor.

More in particular, it is remembered that each cell of a power transistor thus configured works with a current that is sized according to the design. This current, multiplied by the number of cells, is a total current value to be delivered by the power transistor.

By way of non-limiting example, considering a power transistor with three fingers, each comprising ten cells, according to this aspect of the disclosure, it is possible to insert the bipolar elemental cell 30 above described in each finger for a total of three thermal sensing sections. In this way, it is possible to monitor the temperature of these three fingers and thus balance them dynamically.

Alternatively, it is possible to insert two thermal sensing sections per each finger, for example a section at the beginning and a section at the end of the finger, for obtaining a more accurate thermal control on the surface of the fingers and thus of the power transistor as a whole.

Furthermore, it is also possible to use three thermal sensing sections for each finger, thus obtaining a very accurate thermal control. In this case, it is also possible to reduce the number of elemental bipolar structures that compose this power transistor, and thus its area, with a great silicon saving.

It is suitable to underline that the increase of area due to the use of the control circuit 34, although being minimum since they are signal devices, is highly compensated by the use of a smaller power transistor, showing however the same performances as those of a power transistor realized according to the prior art.

An example of layout for a bipolar structure comprising at least one elemental bipolar cell 30 is shown for example in FIG. 3B, globally indicated with 300.

In particular, the layout 300 comprises a first layer 310, in particular a base layer, of the bipolar elemental cell 30 wherein the base contacts 301 of the bipolar elemental cell 30 are realized. This first layer 310 is also the base layer of the power elemental bipolar structure Tpf. The layout 300 also comprises a second layer 320, in particular an emitter layer, of the elemental bipolar cell 30 wherein the emitter contacts 302 of the elemental bipolar cell 30 are realized. The layout 300 also comprises respective collector contacts 330 of the elemental power bipolar structure Tpf.

According to an aspect of the disclosure, the layout 300 further comprises at least one emitter split 305 wherein the sensing transistor Ts is realized.

It is thus immediately clear how the proposed structure may be realized without increasing the sizes of the structure as a whole.

Figures 4A, 4B:
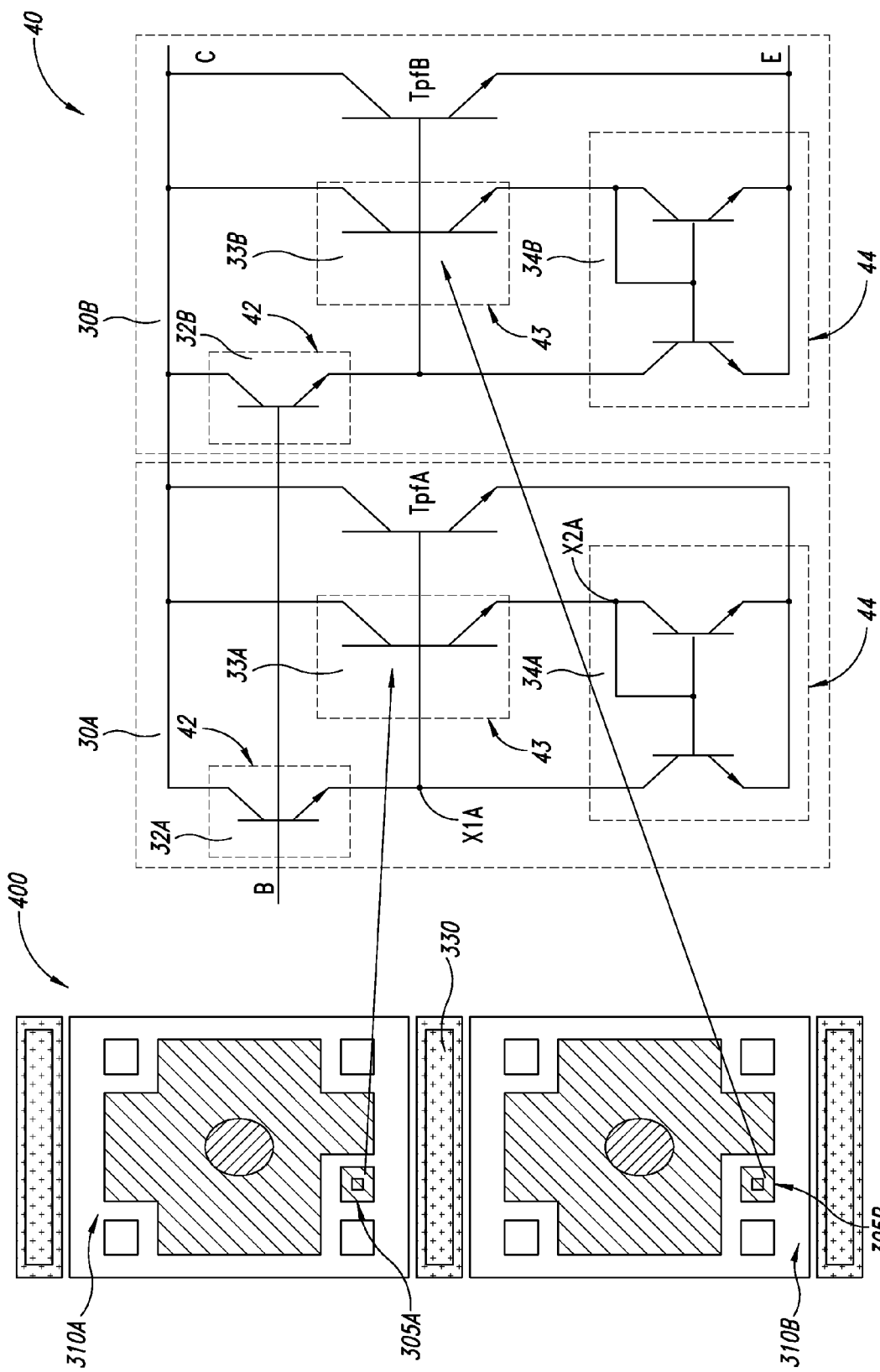
FIG. 4A schematically shows a power bipolar structure realized according to the disclosure.
FIG. 4B schematically shows a layout for the power bipolar structure of FIG. 4A.

With reference instead to FIG. 4A, a power bipolar structure realized according to the present disclosure is shown, globally and schematically indicated with 40. In the example of the figure, the power bipolar structure 40 comprises in particular at least one first and one second elemental bipolar cell, 30A and 30B, realized as previously seen. In particular, only two cells have been used belonging to two different fingers for comprising the operation of the power bipolar structure 40.

The power bipolar structure 40 has a first terminal, in particular a collector terminal C, a second terminal, in particular an emitter terminal E and a third terminal, in particular a base terminal B, these terminals corresponding to the respective terminals of the elemental bipolar cells, 30A and 30B, in turn electrically coupled, in parallel to each other, between the collector terminal C and the emitter terminal E and have base terminals connected to the base terminal B of the power bipolar structure 40.

As previously seen, each elemental bipolar cell, for example the first elemental bipolar cell 30A comprises:

a elemental power bipolar structure TpfA that corresponds in particular to a finger of the multiemitter power bipolar transistor, electrically coupled between the collector terminal C and the emitter terminal E;

a driving section 32A electrically coupled between the collector terminal C and a first inner circuit node X1A and including at least one driving bipolar transistor;

a sensing section 33A, electrically coupled between the collector terminal C and a second inner circuit node X2A and including at least one sensing bipolar transistor, having a base terminal connected to the base terminal of the power bipolar elemental structure and to the first inner circuit node X1A; and a control circuit 34A, connected to the first and second inner circuit nodes, X1A and X2A, as well as to the emitter terminal E and comprising at least one first and one second feedback bipolar transistor.

The driving sections of the elemental bipolar cells together forms a driving block 42 of the power bipolar structure 40 connected to the power bipolar transistor comprised therein. Similarly, the sensing sections together forms a sensing block 43 of the power bipolar structure 40. The driving block 42 is coupled to the power bipolar transistor by means of the sensing block 43. Finally, the control circuits of the elemental bipolar cells together forms a control block 44 of the power bipolar structure 40, in turn connected to the driving block 42 and to the sensing block 43.

An example of layout for a bipolar structure comprising at least two elemental bipolar cells is shown for example in FIG. 4B, globally indicated with 400.

In particular, the layout 400 comprises a first and a second base layer, 310A and 310B, of the elemental bipolar cells, 30A and 30B and at least one collector contact 330. It is suitable to note that, according to this layout 400, the collector contacts are distributed along the fingers of the power bipolar transistor and are not interrupted by the fingers themselves so as to collect all the collector current that flows in this transistor. The collector layer is instead interrupted by the fingers so as to reduce the collector resistance of the power bipolar transistor as a whole.

According to an aspect of the disclosure, the layout 300 also comprises at least one first and one second integrated structure, 305A and 305B, corresponding to respective sensing transistors of the cells.

The elemental bipolar cells, 30A and 30B, thus have power bipolar elemental structures, TpfA and TpfB, corresponding to fingers of the multiemitter power bipolar transistor of the power bipolar structure 40 that are different and near each other. In this way, with the power bipolar structure 40 shown in FIG. 4A, the temperature of the fingers is monitored with only two cells in which a thermal sense is placed being realized by the sensing sections, 33A and 34A.

In case of a collector current unbalance, the temperature of the finger that will have the greater collector current will start to increase and this enhancement will be signaled by the decrease of the base-emitter voltage Vbe of the cell belonging to this finger through the emitter split.

In fact, the elemental power bipolar structure corresponding to the emitter finger that is part of the same structure of the cell will also have a decrease of its base-emitter voltage Vbe according to the enhancement of the temperature.

Due to the increase of the collector current, also the collector current of the sensing transistor will be higher and this current will flow through the emitter terminal towards the control circuit, in this case, a simple npn mirror.

More in particular, the control circuit draws the surplus current from the base terminal of the finger towards the emitter terminal E1 of the power bipolar structure 40.

In this way, a part of the current of the driving transistor is diverted and does not reach the base terminal of the elemental bipolar structure Tpf of the finger, with the result that the beta parameter of the finger is reduced and thus also the collector current is reduced.

Advantageously according to the disclosure, then, by reducing the collector current, locally also the temperature of the same is reduced with a re-increasing of the base-emitter voltage Vbe.

At the same time the other finger undergoes the inverse process since the global current in the two driving transistors is regulated by the feedback control circuit and thus there will be a relative increasing of the collector current on the other finger.

In this way, an accurate control is obtained of the thermal balancing of the power bipolar structure, this control having the possibility to be extended also to power bipolar structures with several fingers and that thus have even more delicate problems of unbalance.

In conclusion, advantageously according to the disclosure, it is possible to use a power bipolar structure with reduced size with respect to the known structures with equal supplied current, thanks to the active control of the current in the base terminal of the elemental power bipolar structures corresponding to the fingers of the multiemitter power bipolar transistor of the structure.

The power bipolar structure provided with sensing sections and with control circuits has a greater area SOA, in particular enlarged in the area of main interest, i.e., the high voltage collector-emitter region.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A power bipolar structure, comprising:
   first, second, and third terminals; and
   a power bipolar transistor having a first elemental bipolar cell electrically coupled to said first, second, and third terminals and including:
      a first elemental power bipolar structure, corresponding to a first finger of said power bipolar transistor, electrically coupled between said first and second terminals;
      a first driving block that includes a first driving section coupled to the first elemental power bipolar structure;
      a first control circuit configured to control the first elemental power bipolar structure; and
      a first sensing section configured to detect information regarding operation of said first elemental power bipolar structure, said first sensing section being configured to supply the first control circuit with a current that depends on a local temperature of said first elemental power bipolar structure,
      wherein said first driving section is electrically coupled between said first terminal and a first inner circuit node and includes a driving bipolar transistor, said first inner circuit node being electrically coupled to a base terminal of said first elemental power bipolar structure, and
      wherein said first sensing section is electrically coupled between said first terminal and a second inner circuit node and includes a sensing bipolar transistor, having in turn a base terminal connected to said base terminal of said first elemental power bipolar structure and to said first inner circuit node.

2. A power bipolar structure according to claim 1, wherein said sensing bipolar transistor is configured to have a base-emitter voltage that follows a value of a base-emitter voltage of said first elemental power bipolar structure and supply a collector current that is a function of the temperature of said first elemental power bipolar structure.

3. A power bipolar structure according to claim 1, wherein said first control circuit is electrically coupled to said second terminal and to the base terminal of said first elemental power bipolar structure, said first control circuit including a bipolar transistor current mirror configured to draw a current surplus from said base terminal of said first elemental power bipolar structure towards said second terminal.

4. A power bipolar structure according to claim 3, wherein:
   said first control circuit is electrically coupled to said first and second inner circuit nodes and to said second terminal, said first control circuit including first and second feedback bipolar transistors, said first feedback bipolar transistor being electrically coupled between said first inner circuit node and said second terminal and having a base terminal electrically coupled to a base terminal of said second feedback bipolar transistor, the second feedback bipolar transistor being electrically coupled between said second inner circuit node and said second terminal, said base terminal of said second feedback bipolar transistor being electrically coupled to said second inner circuit node.

5. A power bipolar structure according to claim 1, wherein the power bipolar transistor includes a second elemental bipolar cell electrically coupled in parallel to the first elemental bipolar cell, between said first and second terminals and electrically coupled to said third terminal, the second elemental bipolar cell including:
   a second elemental power bipolar structure, corresponding to a second finger of said power bipolar transistor, electrically coupled between said first and second terminals;
   a second driving block that includes a first driving section coupled to the second elemental power bipolar structure;
   a second control circuit configured to control the second elemental power bipolar structure; and
   a second sensing section configured to detect information regarding operation of said second elemental power bipolar structure, said second sensing section being configured to supply the second control circuit with a current value that depends on a local temperature of said second elemental power bipolar structure.

6. A power bipolar structure according to claim 5, wherein said sensing sections of said elemental bipolar cells are included in a sensing block of said power bipolar structure.

7. A power bipolar structure according to claim 5, wherein said control circuits of said elemental bipolar cells are included in a control block of said power bipolar structure.

8. A power bipolar structure according to claim 1, comprising at least one elemental bipolar cell for each emitter finger.

9. A power bipolar structure comprising:
   first, second, and third terminals;
   a power bipolar transistor having a first elemental bipolar electrically coupled to said first, second, and third terminals and including:
      a first elemental power bipolar structure, corresponding to a first finger of said power bipolar transistor, electrically coupled between said first and second terminals;
      a first driving block that includes a first driving section coupled to the first elemental power bipolar structure;
      a first control circuit configured to control the first elemental power bipolar structure; and
      a first sensing section configured to detect information regarding operation of said first elemental power bipolar structure, said first sensing section being configured to supply the first control circuit with a current that depends on a local temperature of said first elemental power bipolar structure; and
   a plurality of elemental bipolar cells for each emitter finger.

10. A power bipolar structure according to claim 9, wherein said first control circuit is electrically coupled to said second terminal and to a base terminal of said first elemental power bipolar structure, said first control circuit including a bipolar transistor current mirror configured to draw a current surplus from said base terminal of said first elemental power bipolar structure.

11. A power bipolar structure, comprising:
   first, second, and third terminals; and
   a power bipolar transistor having a first elemental bipolar cell electrically coupled to said first, second, and third terminals and including:
      a first elemental power bipolar structure, corresponding to a first finger of said power bipolar transistor, electrically coupled between said first and second terminals;
      a first sensing section configured to detect information regarding operation of said first elemental power bipolar structure, said first sensing section being configured to supply a current that depends on a local temperature of said first elemental power bipolar structure; and
      a first control circuit configured to draw current from a base terminal of the first elemental power bipolar structure based on the current supplied by the first sensing section, wherein the power bipolar transistor includes a driving bipolar transistor electrically coupled between said first terminal and a first inner circuit node, said first inner circuit node being electrically coupled to the base terminal of the first elemental power bipolar structure, and wherein said first sensing section includes a sensing bipolar transistor electrically coupled between said first terminal and a second inner circuit node and having a base terminal connected to said base terminal of said first elemental power bipolar structure and to said first inner circuit node.

12. A power bipolar structure according to claim 11, wherein said sensing bipolar transistor is configured to have a base-emitter voltage that follows a value of a base-emitter voltage of said first elemental power bipolar structure and supply a collector current that is a function of the temperature of said first elemental power bipolar structure.

13. A power bipolar structure according to claim 11, wherein said first control circuit includes a bipolar transistor current mirror configured to draw the current from said base terminal of said power bipolar elemental structure towards said second terminal.

14. A power bipolar structure according to claim 13, wherein:

said first control circuit is electrically coupled to said first and second inner circuit nodes and to said second terminal, said first control circuit including first and second feedback bipolar transistors, said first feedback bipolar transistor being electrically coupled between said first inner circuit node and said second terminal and having a base terminal connected to a base terminal of said second feedback bipolar transistor, the second feedback bipolar transistor being electrically coupled between said second inner circuit node and said second terminal, said base terminal of said second feedback bipolar transistor being electrically coupled to said second inner circuit node.

15. A power bipolar structure according to claim 11, wherein the power bipolar transistor includes a second elemental bipolar cell electrically coupled in parallel to the first elemental bipolar cell, between said first and second terminals and electrically coupled to said third terminal, the second elemental bipolar cell including:

a second elemental power bipolar structure, corresponding to a second finger of said power bipolar transistor, electrically coupled between said first and second terminals;

a second sensing section configured to detect information regarding operation of said second elemental power bipolar structure, said second sensing section being configured to supply a current that depends on a local temperature of said second elemental power bipolar structure; and a second control circuit configured to draw current from a base terminal of the second elemental power bipolar structure based on the current supplied by the second sensing section.

16. A power bipolar structure, comprising:

first, second, and third terminals; and a power bipolar transistor having a first elemental bipolar cell electrically coupled to said first, second, and third terminals and including:

a first elemental power bipolar structure, corresponding to a first finger of said power bipolar transistor, electrically coupled between said first and second terminals;

first means for detecting information regarding operation of said first elemental power bipolar structure, supplying a first current that depends on a local temperature of said first elemental power bipolar structure; and drawing a second current from a base terminal of the first elemental power bipolar structure based on the first current, wherein the first elemental bipolar cell includes a driving bipolar transistor electrically coupled between said first terminal and a first inner circuit node, said first inner circuit node being electrically coupled to the base terminal of the first elemental power bipolar structure, and wherein said first means includes a sensing bipolar transistor electrically coupled between said first terminal and a second inner circuit node and having a base terminal connected to said base terminal of said first elemental power bipolar structure and to said first inner circuit node.

17. A power bipolar structure according to claim 16, wherein said sensing bipolar transistor is configured to have a base-emitter voltage that follows a value of a base-emitter voltage of said elemental power bipolar structure and supply a collector current that is a function of the temperature of said elemental power bipolar structure.

18. A power bipolar structure according to claim 16, wherein said first means includes a bipolar transistor current mirror configured to draw the second current from said base terminal of said power bipolar elemental structure towards said second terminal.

\* \* \* \* \*